United States Patent
Ashworth et al.

(10) Patent No.: US 9,444,543 B2
(45) Date of Patent: Sep. 13, 2016

(54) MULTIPLE-PORT SIGNAL BOOSTERS

(71) Applicant: Wilson Electronics, LLC, St. George, UT (US)

(72) Inventors: Christopher K. Ashworth, St. George, UT (US); Vernon A. Van Buren, Cedar City, UT (US)

(73) Assignee: WILSON ELECTRONICS, LLC, St. George, UT (US)

( * ) Notice: Subject to any disclaimer, the term of this patent is extended or adjusted under 35 U.S.C. 154(b) by 0 days.

(21) Appl. No.: 14/689,714

(22) Filed: Apr. 17, 2015

(65) Prior Publication Data

US 2016/0028469 A1   Jan. 28, 2016

Related U.S. Application Data (62) Division of application No. 14/339,098, filed on Jul. 23, 2014, now Pat. No. 9,054,664.

(51) Int. Cl.
*H04B 7/204* (2006.01)
*H04B 7/155* (2006.01)
(Continued)

(52) U.S. Cl.
CPC ............ *H04B 7/15535* (2013.01); *H03F 3/19* (2013.01); *H03F 3/211* (2013.01); *H03F 3/245* (2013.01); *H03F 3/68* (2013.01); *H03G 3/3042* (2013.01); *H03G 3/3052* (2013.01); *H04B 7/204* (2013.01); *H03F 2200/105* (2013.01); *H03F 2200/255* (2013.01); *H03F 2200/411* (2013.01);
(Continued)

(58) Field of Classification Search
CPC ......... H03F 1/0277; H04B 7/15; H04B 1/18; H01P 1/213; H01P 5/12; H03H 7/46
See application file for complete search history.

(56) References Cited

U.S. PATENT DOCUMENTS 5,550,813 A   8/1996   Vella-Coleiro
6,292,371 B1  9/2001   Toner, Jr.
(Continued)

FOREIGN PATENT DOCUMENTS

EP        2157694 A1    2/2010

OTHER PUBLICATIONS

"Multi-Standard or PAL/NTSC Modulator with integrated antenna booster/splitter ICs Datasheet," Motorola, Inc., MC44BC373, http://pdf1.alldatasheet.com/datasheet-pdf/view/90144/MOTOROLA/MC44BC373.html; Accessed May 6, 2014.
(Continued)

*Primary Examiner* — Sujatha Sharma
(74) *Attorney, Agent, or Firm* — Thorpe North & Western LLP (57) ABSTRACT

A system is disclosed that includes a first interface port, a second interface port, a signal splitter device, a main booster, and a front-end booster. The signal splitter device may include first, second, and third splitter ports. The signal splitter device may be configured such that a first direction signal received at either of the second and third splitter ports is output at the first splitter port and a second direction signal that is received at the first splitter port is output at each of the second and third splitter ports. The main booster may include main first and second direction amplification paths that are each communicatively coupled between the first splitter port and the first interface port. The front-end booster may include front-end first and second direction amplification paths that are each communicatively coupled between the second splitter port and the second interface port.

13 Claims, 6 Drawing Sheets

(51) Int. Cl.
*H03F 3/19* (2006.01)
*H03F 3/21* (2006.01)
*H03F 3/24* (2006.01)
*H03F 3/68* (2006.01)
*H03G 3/30* (2006.01)

(52) U.S. Cl.
CPC ..... *H03F2200/451* (2013.01); *H03F 2200/99* (2013.01); *H03F 2203/21142* (2013.01); *H03F 2203/21151* (2013.01)

(56) References Cited

U.S. PATENT DOCUMENTS

| | | | |
|---|---|---|---|
| 6,323,742 | B1 | 11/2001 | Ke |
| 6,424,634 | B1 | 7/2002 | Shiffman et al. |
| 7,171,173 | B2 | 1/2007 | Zangerl |
| 7,486,892 | B2 | 2/2009 | Buabbud et al. |
| 7,706,744 | B2 | 4/2010 | Rodgers et al. |
| 7,729,656 | B2 | 6/2010 | Van Buren |
| 7,912,431 | B2 | 3/2011 | Phillips et al. |
| 8,005,513 | B2 | 8/2011 | Risheq et al. |
| 8,036,594 | B2 | 10/2011 | Schadler |
| 8,712,466 | B2 | 4/2014 | Martineau et al. |
| 8,760,241 | B1 | 6/2014 | Ashworth et al. |
| 9,054,664 | B1 | 6/2015 | Ashworth et al. |
| 2002/0123306 | A1* | 9/2002 | Masoian ................ H04B 7/155 455/7 |
| 2005/0107052 | A1 | 5/2005 | Zangerl |
| 2007/0099667 | A1 | 5/2007 | Graham et al. |
| 2009/0156118 | A1* | 6/2009 | Schadler .............. H01Q 21/205 455/25 |
| 2009/0181722 | A1 | 7/2009 | Stensson |
| 2010/0146564 | A1 | 6/2010 | Halik et al. |
| 2010/0197222 | A1* | 8/2010 | Scheucher ............ H01Q 19/30 455/11.1 |
| 2012/0190316 | A1 | 7/2012 | Martineau et al. |
| 2012/0214406 | A1* | 8/2012 | Risheq ............... H04B 7/15535 455/7 |
| 2014/0084700 | A1 | 3/2014 | Anderson et al. |
| 2015/0011157 | A1* | 1/2015 | Terry ................. H04B 7/15535 455/10 |

OTHER PUBLICATIONS

Safarian, A.; Lei Zhou; Heydari, P., "CMOS Distributed Active Power Combiners and Splitters for Multi-Antenna UWB Beamforming Transceivers," Solid-State Circuits, IEEE Journal of, vol. 42, No. 7, pp. 1481-1491, Jul. 2007, DOI: 10.1109/JSSC.2007.899121.

Emami, S.; Wiser, R.F.; Ali, E.; Forbes, M.G.; Gordon, M.O.; Xiang Guan; Lo, S.; McElwee, P.T.; Parker, J.; Tani, J.R.; Gilbert, J.M.; Doan, C.H., "A 60GHz CMOS phased-array transceiver pair for multi-Gb/s wireless communications," Solid-State Circuits Conference Digest of Technical Papers (ISSCC), 2011 IEEE International, pp. 164-166, Feb. 20-24, 2011; DOI: 10.1109/ISSCC.2011.5746265, San Francisco, California.

* cited by examiner

MULTIPLE-PORT SIGNAL BOOSTERS

CROSS-REFERENCE TO RELATED APPLICATIONS

This application is a divisional of U.S. patent application Ser. No. 14/339,098, filed Jul. 23, 2014, titled MULTIPLE-PORT SIGNAL BOOSTERS, which is incorporated herein by reference in its entirety.

FIELD

The embodiments discussed herein are related to multiple-port signal boosters.

BACKGROUND

In a wireless communication system, communication may occur as uplink communications and downlink communications. Uplink communications may refer to communications that originate at a wireless communication device (referred to hereinafter as "wireless device") and that are transmitted to an access point (e.g., base station, remote radio head, wireless router, etc.) associated with the wireless communication system. Downlink communications may refer to communications from the access point to the wireless device.

Sometimes a wireless device in a wireless communication system may be positioned such that it may not adequately receive uplink and/or downlink communications from an access point. In these situations, a user of the wireless device may employ a signal booster to boost the uplink and/or downlink communications.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of one or more embodiments, a method of operating a multiple-port signal booster is disclosed. The method may include detecting a first power level of a first signal and adjusting a first adjustable gain based on the first power level. The method may also include applying the first adjustable gain to the first signal and detecting a second power level of a second signal. The method may also include adjusting a second adjustable gain based on the second power level and applying the second adjustable gain to the second signal. The method may also include after detecting the first power level, applying the first adjustable gain, detecting the second power level, and applying the second adjustable gain, combining the first and second signals into a third signal. The method may also include detecting a third power level of the third signal, adjusting a third adjustable gain based on the third power level, and applying the third adjustable gain to the third signal.

According to an aspect of one or more embodiments, a system is disclosed that includes a first interface port, a second interface port, a signal splitter device, a main booster and a front-end booster. The signal splitter device may include a first splitter port, a second splitter port, and a third splitter port. The signal splitter device may be configured such that a first direction signal received at either of the second and third splitter ports is output at the first splitter port and a second direction signal, which traverses in a direction opposite of the first direction signal, that is received at the first splitter port is output at each of the second and third splitter ports. The main booster may include a main first direction amplification path and a main second direction amplification path that are each communicatively coupled between the first splitter port and the first interface port. The front-end booster may include a front-end first direction amplification path and a front-end second direction amplification path that are each communicatively coupled between the second splitter port and the second interface port.

The object and advantages of the embodiments will be realized and achieved at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to some embodiments, a signal booster may include an outside interface port for coupling to an outside antenna and multiple inside interface ports each configured to be coupled to an inside antenna. The signal booster may also include a main booster coupled to the outside interface port and multiple front-end boosters. Each of the front-end boosters may be coupled to one of the inside interface ports. A signal splitter device may couple the outside interface port and the multiple front-end interface ports. In particular, the signal splitter device may split a signal from the main booster and may provide the split signal to multiple front-end boosters. The signal splitter device may also combine signals from the multiple front-end boosters and provide them to the main booster. Each of the multiple front-end boosters and the main booster may have variable gains to compensate for signals with variable power levels, booster oscillations, among other related issues that may affect the behavior of the signal booster or a wireless network in which the signal booster operates.

Figure 1:
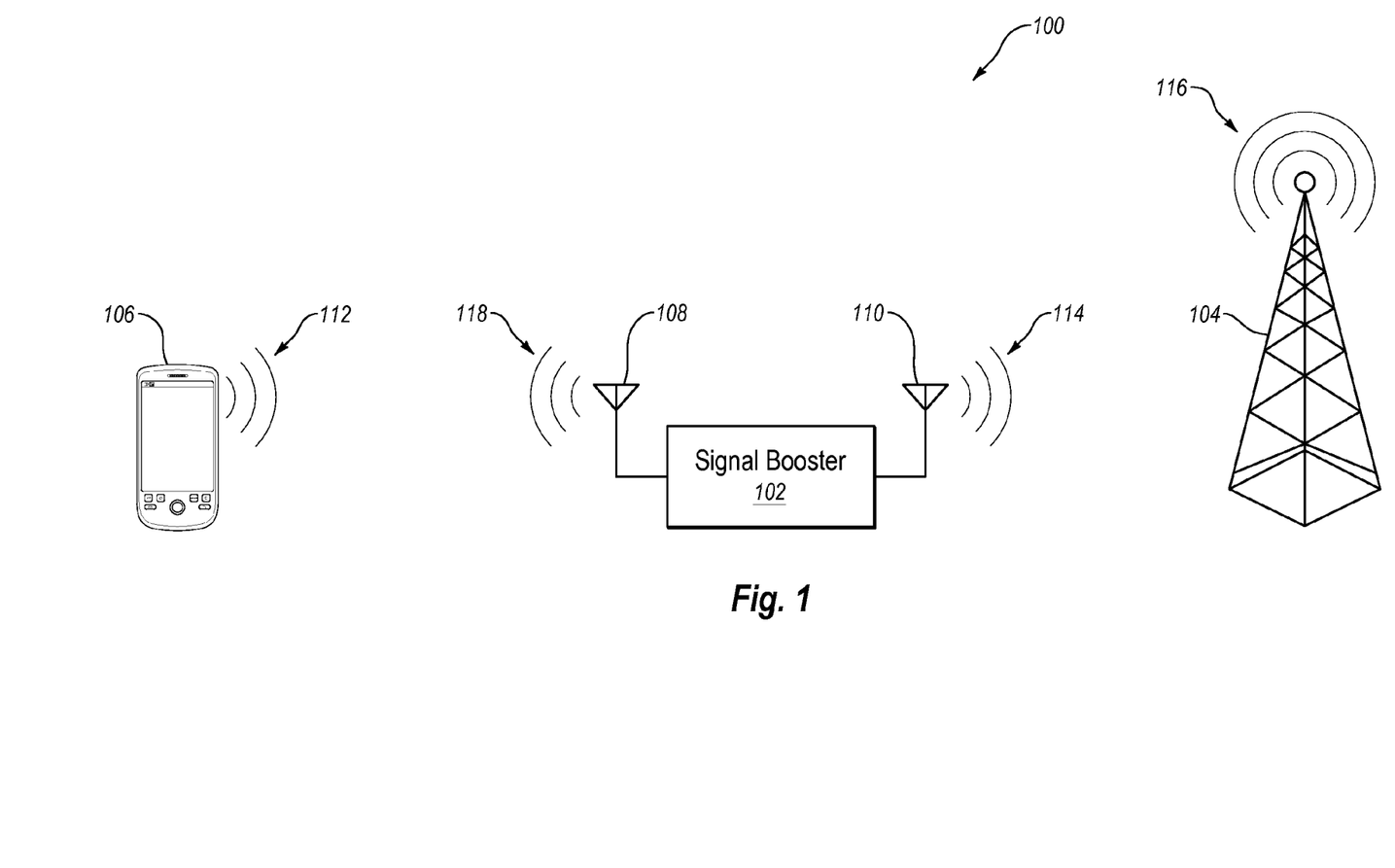
FIG. 1 illustrates an example wireless communication system.

FIG. 1 illustrates an example wireless communication system 100 (referred to hereinafter as "system 100"), arranged in accordance with at least some embodiments described herein. The system 100 may be configured to provide wireless communication services to a wireless device 106 via an access point 104. The system 100 may further include a bidirectional signal booster 102 (referred to hereinafter as "the signal booster 102"). The signal booster 102 may be any suitable system, device, or apparatus configured to receive wireless signals (e.g., radio frequency (RF) signals) communicated between the access point 104 and the wireless device 106. The signal booster 102 may be configured to amplify, repeat, filter, and/or otherwise process the received wireless signals and may be configured to re-transmit the processed wireless signals. Although not expressly illustrated in FIG. 1, the system 100 may include any number of access points 104 configured to provide wireless communication services to any number of wireless devices 106.

The wireless communication services provided by the system 100 may include voice services, data services, messaging services, and/or any suitable combination thereof. The system 100 may include a Frequency Division Duplexing (FDD) network, a Frequency Division Multiple Access (FDMA) network, an Orthogonal FDMA (OFDMA) network, a Code Division Multiple Access (CDMA) network, a Time Division Multiple Access (TDMA) network, a Direct Sequence Spread Spectrum (DSSS) network, a Frequency Hopping Spread Spectrum (FHSS) network, and/or some other wireless communication network. In some embodiments, the system 100 may be configured to operate as a second generation (2G) wireless communication network, a third generation (3G) wireless communication network, a fourth generation (4G) wireless communication network, and/or a Wi-Fi network. In these or other embodiments, the system 100 may be configured to operate as a Long Term Evolution (LTE) or LTE Advanced wireless communication network.

The access point 104 may be any suitable wireless network communication point and may include, by way of example but not limitation, a base station, a remote radio head (RRH), a satellite, a wireless router, or any other suitable communication point. The wireless device 106 may be any device that may use the system 100 for obtaining wireless communication services and may include, by way of example and not limitation, a cellular phone, a smartphone, a personal data assistant (PDA), a laptop computer, a personal computer, a tablet computer, a wireless communication card, or any other similar device configured to communicate within the system 100.

As wireless signals propagate between the access point 104 and the wireless device 106, the wireless signals may be affected during the propagation such that, in some instances, the wireless signals may be substantially degraded. The signal degradation may result in the access point 104 or the wireless device 106 not receiving, detecting, or decoding information from the wireless signals. Therefore, the signal booster 102 may be configured to increase the power of and/or improve the signal quality of the wireless signals such that the communication of the wireless signals between the access point 104 and the wireless device 106 may be improved.

In some embodiments, the signal booster 102 may receive a wireless signal communicated between the access point 104 and the wireless device 106 and may convert the wireless signal into an electrical signal (e.g., via an antenna). The signal booster 102 may be configured to amplify the electrical signal and the amplified electrical signal may be converted into an amplified wireless signal (e.g., via an antenna) that may be transmitted. The signal booster 102 may amplify the electrical signal by applying a gain to the electrical signal. The gain may be a set gain or a variable gain, and may be less than, equal to, or greater than one. Therefore, in the present disclosure, the term "amplify" may refer to applying any gain to a wireless signal including gains that are less than one.

In some embodiments, the signal booster 102 may adjust the gain based on conditions associated with communicating the wireless signals (e.g., providing noise floor, internal oscillation, external oscillation (e.g., antenna to antenna oscillations), and/or overload protection). In these and other embodiments, the signal booster 102 may adjust the gain in real time. The signal booster 102 may also filter out noise associated with the received wireless signal such that the retransmitted wireless signal may be a cleaner signal than the received wireless signal. Therefore, the signal booster 102 may improve the communication of wireless signals between the access point 104 and the wireless device 106.

For example, the wireless device 106 may communicate a wireless uplink signal 112 intended for reception by the access point 104 and a first antenna 108 may be configured to receive the wireless uplink signal 112. The first antenna 108 may be configured to convert the received wireless uplink signal 112 into an electrical uplink signal. Additionally, the first antenna 108 may be communicatively coupled to a first interface port (not expressly depicted in FIG. 1) of the signal booster 102 such that the signal booster 102 may receive the electrical uplink signal from the first antenna 108 at the first interface port. An interface port may be any suitable port configured to interface the signal booster 102 with another device (e.g., an antenna, a modem, another signal booster, etc.) from which the signal booster 102 may receive a signal and/or to which the signal booster 102 may communicate a signal.

In some embodiments, the signal booster 102 may be configured to apply a gain to the electrical uplink signal to amplify the electrical uplink signal. In the illustrated embodiment, the signal booster 102 may direct the amplified electrical uplink signal toward a second interface port (not expressly depicted in FIG. 1) of the signal booster 102 that may be communicatively coupled to a second antenna 110. The second antenna 110 may be configured to receive the amplified electrical uplink signal from the second interface port and may convert the amplified electrical uplink signal into an amplified wireless uplink signal 114 that may also be transmitted by the second antenna 110. The amplified wireless uplink signal 114 may then be received by the access point 104.

In some embodiments, the signal booster 102 may also be configured to filter the electrical uplink signal to remove at least some noise associated with the received wireless uplink signal 112. Consequently, the amplified wireless uplink signal 114 may have a better signal-to-noise ratio (SNR) than the wireless uplink signal 112 that may be received by the first antenna 108. Accordingly, the signal booster 102 may be configured to improve the communication of uplink signals, which may be first direction signals, between the access point 104 and the wireless device 106. The use of the term "uplink signal," without specifying wireless or electrical uplink signals, may refer to wireless uplink signals or electrical uplink signals.

As another example, the access point 104 may communicate a wireless downlink signal 116 intended for the wireless device 106 and the second antenna 110 may be configured to receive the wireless downlink signal 116. The second antenna 110 may convert the received wireless downlink signal 116 into an electrical downlink signal such that the electrical downlink signal may be received at the second interface port of the signal booster 102. In some embodiments, the signal booster 102 may be configured to apply a gain to the electrical downlink signal to amplify the electrical downlink signal. The signal booster 102 may also be configured to direct the amplified electrical downlink signal toward the first interface port of the signal booster 102 such that the first antenna 108 may receive the amplified electrical downlink signal. The first antenna 108 may be configured to convert the amplified electrical downlink signal into an amplified wireless downlink signal 118 that may also be transmitted by the first antenna 108. The amplified wireless downlink signal 118 may then be received by the wireless device 106.

In some embodiments, the signal booster 102 may also be configured to filter the electrical downlink signal to remove at least some noise associated with the received wireless downlink signal 116. Therefore, the amplified wireless downlink signal 118 may have a better SNR than the wireless downlink signal 116 received by the second antenna 110. Accordingly, the signal booster 102 may also be configured to improve the communication of downlink signals, which may be second direction signals, between the access point 104 and the wireless device 106. The use of the term "downlink signal," without specifying wireless or electrical downlink signals, may refer to wireless downlink signals or electrical downlink signals.

Modifications may be made to the system 100 without departing from the scope of the present disclosure. For example, in some embodiments, the distance between the signal booster 102 and the wireless device 106 may be relatively close as compared to the distance between the signal booster 102 and the access point 104. Further, the system 100 may include any number of signal boosters 102, access points 104, and/or wireless devices 106. Additionally, in some embodiments, the signal booster 102 may be coupled to multiple antennas, like the first antenna 108, that are configured to communicate with wireless devices. Also, in some embodiments, the signal booster 102 may be included in a cradle configured to hold the wireless device 106. Additionally, in some embodiments, the signal booster 102 may be configured to communicate with the wireless device 106 via wired communications (e.g., using electrical signals communicated over a wire) instead of wireless communications (e.g., via wireless signals).

Additionally, although the signal booster 102 is illustrated and described with respect to performing operations with respect to wireless communications such as receiving and transmitting wireless signals via the first antenna 108 and the second antenna 110, the scope of the present disclosure is not limited to such applications. For example, in some embodiments, the signal booster 102 (or other signal boosters described herein) may be configured to perform similar operations with respect to communications that are not necessarily wireless, such as processing signals that may be received and/or transmitted via one or more modems or other signal boosters communicatively coupled to the interface ports of the signal booster 102 via a wired connection.

Figure 2:
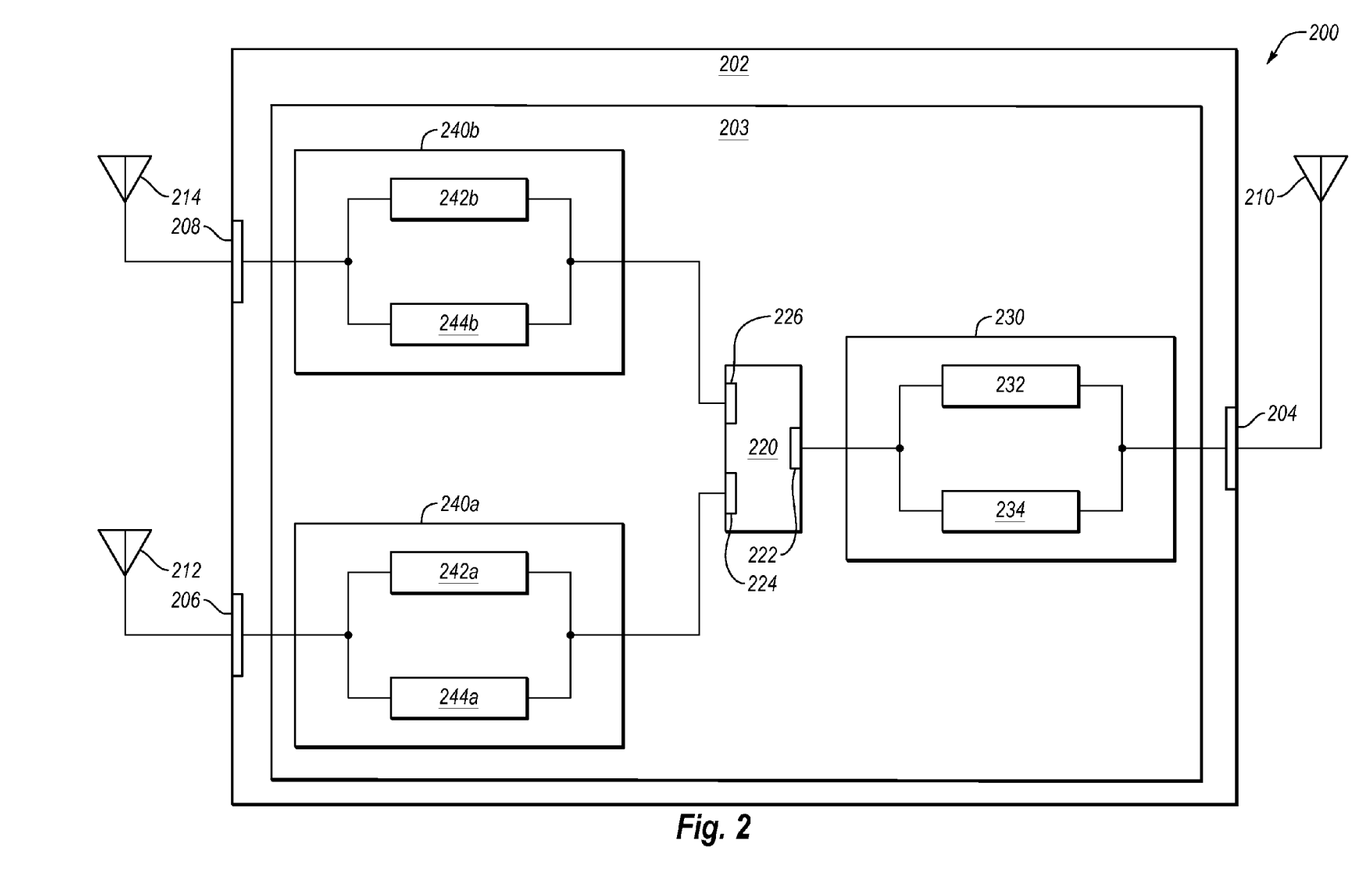
FIG. 2 illustrates an example system with an example multiple-port signal booster.

FIG. 2 illustrates an example system 200 with an example multiple-port signal booster 202, arranged in accordance with at least some embodiments described herein. In some embodiments, the system 200 may be part of a wireless communication system, such as the wireless communication system 100 illustrated in FIG. 1, and may further include first, second, and third antennas 210, 212, and 214. In these and other embodiments, the signal booster 202 may operate in a similar manner as the signal booster 102 of FIG. 1.

The signal booster 202 may include a first interface port 204, a second interface port 206, a third interface port 208, a main booster 230, a first front-end booster 240a, and a second front-end booster 240b, referred to herein as the front-end boosters 240, and a signal splitter device 220. In some embodiments, the front-end boosters 240, the signal splitter device 220, and the main booster 230 may be coupled to a single supporting device 203. The supporting device may be a printed circuit board (PCB), a substrate, or some other supporting device.

The signal splitter device 220 may include first, second, and third splitter ports 222, 224, and 226. The main booster 230 may include a main uplink amplification path 232 and a main downlink amplification path 234. The first front-end booster 240a may include a first uplink amplification path 242a and a first downlink amplification path 244a. The second front-end booster 240b may include a second uplink amplification path 242b and a second downlink amplification path 244b.

The main booster 230 may be coupled between the first interface port 204 and the first splitter port 222. The first front-end booster 240a may be coupled between the second interface port 206 and the second splitter port 224. The second front-end booster 240b may be coupled between the third interface port 208 and the third splitter port 226. The first interface port 204 may be coupled to the first antenna 210. The second interface port 206 may be coupled to the second antenna 212. The third interface port 208 may be coupled to the third antenna 214.

In the illustrated embodiment of FIG. 2, the first antenna 210 may be configured to receive downlink signals from and transmit uplink signals to an access point. The second and third antennas 212 and 214 may be configured to receive uplink signals from and transmit downlink signals to one or more wireless devices.

The main booster 230 and the front-end boosters 240 may be configured to receive uplink and downlink signals and to apply gains to the uplink and downlink signals. In particular, the uplink amplification paths 232, 242a, and 242b may apply gains to the uplink signals and the downlink amplification paths 234, 244a, and 244b may apply gains to the downlink signals. In some embodiments, the gains applied by the uplink amplification paths 232, 242a, and 242b and the downlink amplification paths 234, 244a, and 244b may be greater than, less than, or equal to one.

The signal splitter device 220 may be configured to split downlink signals received on the first splitter port and to provide the downlink signals on both the second and third splitter ports 224 and 226. In these and other embodiments, splitting the downlink signals may replicate the data of the downlink signals such that the downlink signals on each of the second and third splitter ports 224 and 226 may include the same data. However, the signal splitter device 220 when splitting the downlink signals may reduce power levels of the downlink signals provided to the second and third splitter ports 224 and 226. For example, in some embodiments, the downlink signals on the second and third splitter ports 224 and 226 may have a power level that is reduced by 1, 3, 5, 7, 9, 10, or more decibels or some other number of decibels as compared to the power level of the downlink signals on the first splitter port 222.

The signal splitter device 220 may be further configured to combine uplink signals received on the second and third splitter ports 224 and 226 and to provide the combined uplink signals on the first splitter port 222. In these and other embodiments, the data on the uplink signals received on the second and third splitter ports 224 and 226 may be carried by the combined uplink signals on the first splitter port 222. However, the signal splitter device 220 when combining the uplink signals may reduce power levels of the uplink signals provided by the second and third splitter ports 224 and 226. For example, in some embodiments, the combined uplink signals on the first splitter port 222 may have a power level that is reduced by 1, 3, 5, 7, 9, 10, or more decibels or some other number of decibels as compared to the power level of the uplink signals on the second and third splitter ports 224 and 226.

In some embodiments, the signal splitter device 220 may be an active or passive device. Alternately or additionally, the signal splitter device 220 may include one or more of a signal splitter, a coupler, a tap, a resistive splitter, and a Wilkinson divider, or some combination thereof.

In general, the front-end boosters 240 may be configured to apply a gain to the uplink and downlink signals to compensate for a reduction in power levels of the uplink and downlink signals caused by the signal splitter device 220. In this configuration, the main booster 230 may be configured to apply a general amplification to the uplink and downlink signals based on configurations of the wireless communication network in which the signal booster 202 is operating. For example, the main booster 230 may operate to increase or decrease a gain applied to the uplink and downlink signals based on noise levels at the access point, government regulations, and wireless communication operator regulations, among others. In short, the main booster 230 may apply any known algorithm or scheme to apply gain to downlink and uplink signals to enhance or otherwise make communications between a wireless device and an access point function within the constraints of the wireless communications network in which the signal booster 202 is operating.

A description of the operation of the system 200 with respect to uplink and downlink signals follows. Downlink signals may be received by the first antenna 210 from an access point and provided to the main booster 230. The main booster 230 may provide the downlink signals to the downlink amplification path 234. The downlink amplification path 234 may apply a gain to the downlink signals based on the characteristics of the wireless communication network in which the system 200 is operating. The main booster 230 may provide the downlink signals to the first splitter port 222 of the signal splitter device 220.

The signal splitter device 220 may provide the downlink signals on both the second and third splitter ports 224 and 226, such that the downlink signals are provided to both the front-end boosters 240. The downlink amplification paths 244 of the front-end boosters 240 may apply a gain to the downlink signals and provide the downlink signals to the second and third antennas 212 and 214, respectively. In these and other embodiments, the second and third antennas 212 and 214 may be positioned in separate locations to serve different wireless devices. For example, the second antenna 212 may be in a first portion of a building and may provide the downlink signals to wireless devices in the first portion of the building. The third antenna 214 may be in a second portion of the building and may provide the downlink signal to wireless devices in the second portion of the building.

First uplink signals from one or more first wireless devices may be received at the second antenna 212 and provided to the first front-end booster 240a. The first uplink amplification path 242a may apply a gain to the first uplink signals and may provide the first uplink signals to the second splitter port 224 of the signal splitter device 220.

Second uplink signals from one or more second wireless devices may be received at the third antenna 214 and provided to the second front-end booster 240b. The second uplink amplification path 242b may apply a gain to the second uplink signals and may provide the second uplink signals to the third splitter port 226 of the signal splitter device 220.

The signal splitter device 220 may combine the first and second uplink signals and provide the combined uplink signals to the main booster 230. The main booster 230 may provide the combined uplink signals to the uplink amplification path 232. The uplink amplification path 232 may apply a gain to the combined uplink signals based on the characteristics of the wireless communication network in which the system 200 is operating. The main booster 230 may provide the combined uplink signals to the first antenna 210 for transmission to an access point.

Without the front-end boosters 240, the noise level of uplink signal would increase based on the loss of the signal splitter device 220. Furthermore, without the front-end boosters 240, the signal power of the downlink systems would decrease based on the loss of the signal splitter device 220. In some countries, governmental agencies or other rule making bodies may limit the gain of the main booster 230. As a result, without the front-end boosters 240, compensation for the losses associated with the signal splitter device 220 may not be made. To avoid these losses without using the front-end boosters 240, two separate boosters, similar to the main booster 230 may be used. However, in some circumstances, using the system 200 as illustrated may result in lower costs than two separate boosters. Furthermore, the system 200 may be simpler and provide for integrated communication between the main booster 230 and the front-end boosters 240.

Modifications, additions, or omissions may be made to the system 200 without departing from the scope of the present disclosure. For example, in some embodiments, the signal booster 202 may include additional interface ports that are coupled to antennas that are configured to communicate with wireless devices. In these and other embodiments, each of the interface ports may be coupled to a front-end booster similar to the front-end boosters 240. Alternately or additionally, in some embodiments, the signal booster 202 may not include a front-end booster for each of the interface ports that is coupled to an antenna that communicates with wireless devices. For example, in some embodiments, the signal booster 202 may not include one of the first or second front-end boosters 240.

Furthermore, the signal booster 202 may include multiple other front-end boosters and main boosters. As illustrated, the signal booster 202 may operate to apply gains to a single band of signals in a wireless communication system. In other embodiments, the signal booster 202 may operate to apply gains to multiple bands of signals in a wireless communication system. In these and other embodiments, the signal boosters may include a main booster and front-end boosters as illustrated for every band. The boosters for the bands may be coupled to the first, second, and third antennas 210, 212, and 214, in an analogous manner as illustrated in FIG. 2.

Figure 3:
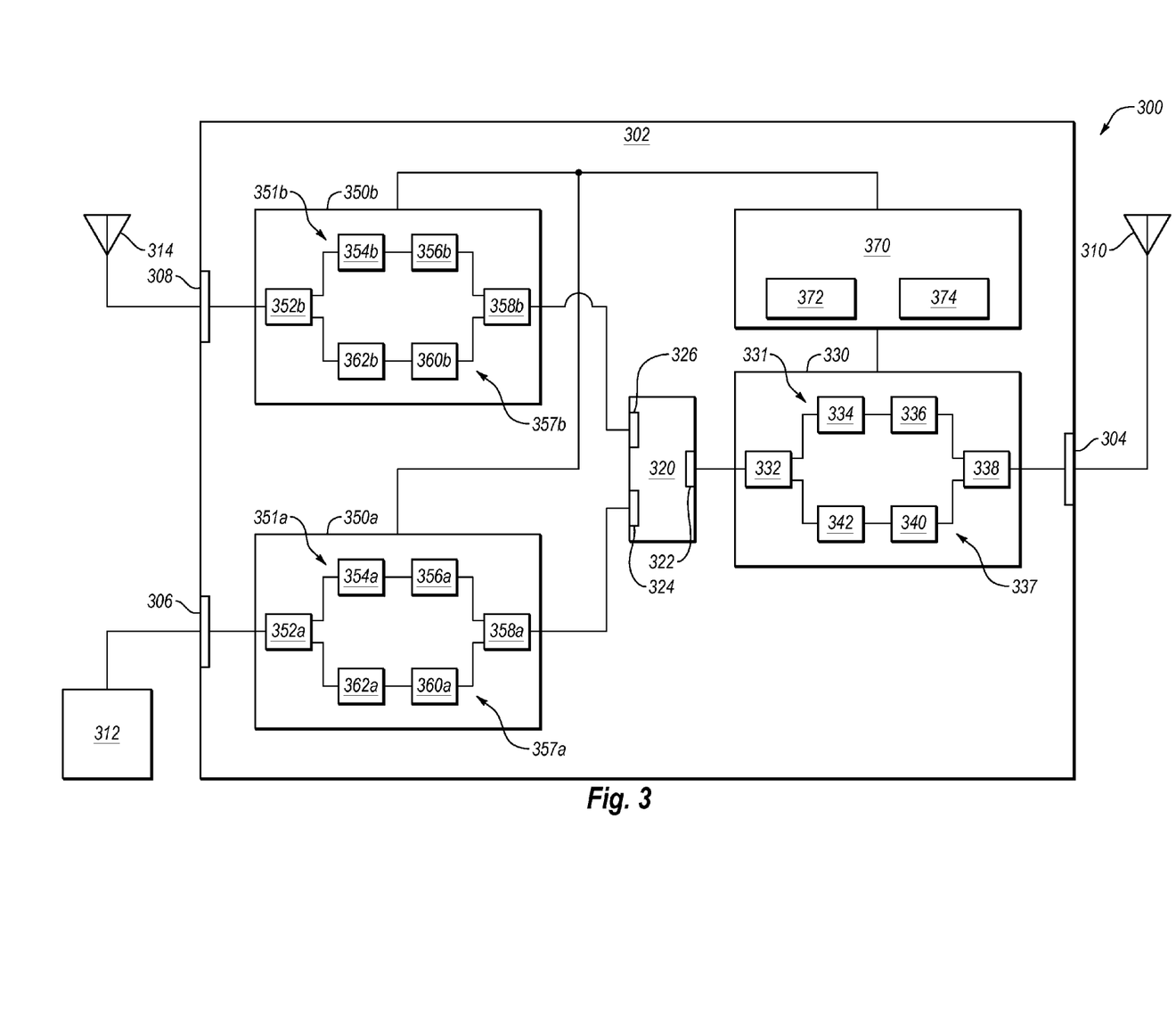
FIG. 3 illustrates another system with another example multiple-port signal booster.

FIG. 3 illustrates another example system 300 that includes another example multiple-port signal booster 302. In some embodiments, the system 300 may be part of a wireless communication system, such as the wireless communication system 100 illustrated in FIG. 1. The system 300 may include first and second antennas 310 and 314 and a communication device 312. In these and other embodiments, the signal booster 302 may operate in an analogous manner as the signal booster 102 of FIG. 1 and the signal booster 202 of FIG. 2.

The signal booster 302 may include a first interface port 304, a second interface port 306, a third interface port 308, a main booster 330, a first front-end booster 350a, and a second front-end booster 350*b*, referred to herein as the front-end boosters 350, a signal splitter device 320, and a control unit 370.

The signal splitter device 320 may include first, second, and third splitter ports 322, 324, and 326 and may be analogous to the signal splitter device 220 of FIG. 2. The main booster 330 may include a main uplink amplification path 331 and a main downlink amplification path 337. The first front-end booster 350*a* may include a first front-end uplink amplification path 351*a* and a first front-end downlink amplification path 357*a*. The second front-end booster 350*b* may include a second front-end uplink amplification path 351*b* and a second front-end downlink amplification path 357*b*.

The main booster 330 may be coupled between the first interface port 304 and the first splitter port 322. The first front-end booster 350*a* may be coupled between the second interface port 306 and the second splitter port 324. The second front-end booster 350*b* may be coupled between the third interface port 308 and the third splitter port 326. The first interface port 304 may be coupled to the first antenna 310. The second interface port 306 may be coupled to the communication device 312. The third interface port 308 may be coupled to the second antenna 212. The communication device 312 may be any device that is configured to receive communication signals. For example, the communication device 312 may be a computing device, such as a computer, a modem, or some other type of device.

In the illustrated embodiment of FIG. 3, the first antenna 310 may be configured to receive downlink signals from and transmit uplink signals to an access point. The second antenna 212 may be configured to receive uplink signals from and transmit downlink signals to one or more wireless devices.

The main booster 330 and the front-end boosters 350 may be configured to receive uplink and downlink signals and to apply a gain to the uplink and downlink signals. In particular, the main and front-end uplink amplification paths 331, 351*a*, and 351*b* may be configured to apply gains to the uplink signals and the main and front-end downlink amplification paths 337, 357*a*, and 357*b* may be configured to apply gains to the downlink signals. In some embodiments, the gains applied by the main and front-end uplink amplification paths 331, 351*a*, and 351*b* and the main and front-end downlink amplification paths 337, 357*a*, and 357*b* may be greater than, less than, or equal to one.

The main uplink amplification path 331 may include a first main duplexer 332, a main uplink gain unit 334, a main uplink signal power level detector 336 (referred to herein as the main uplink detector 336), and a second main duplexer 338. The main downlink amplification path 337 may include the first main duplexer 332, a main downlink gain unit 340, a main downlink signal power level detector 342 (referred to herein as the main downlink detector 342), and the second main duplexer 338.

The main uplink gain unit 334 and the main downlink gain unit 340 may be configured to apply gains to the uplink and downlink signals, respectively, in the main booster 330. In some embodiments, the gain applied by the main uplink gain unit 334 and the main downlink gain unit 340 may be controlled by the control unit 370. As a result, the main uplink gain unit 334 and the main downlink gain unit 340 may adjust the gains applied to the uplink and downlink signals, respectively, in the main booster 330 based on instructions, such as a control signal, from the control unit 370.

The main uplink detector 336 and the main downlink detector 342 may be configured to detect a power level of uplink and downlink signals, respectively, in the main booster 330. The main uplink detector 336 and the main downlink detector 342 may be configured to provide the detected power levels to the control unit 370 as the main uplink and downlink power levels.

The first front-end uplink amplification path 351*a* may include a first front-end duplexer 352*a*, a first front-end uplink gain unit 354*a*, a first front-end uplink signal power level detector 356*a* (referred to herein as the first uplink detector 356*a*), and a second front-end duplexer 358*a*. The first front-end downlink amplification path 357*a* may include the first front-end duplexer 352*a*, a first front-end downlink gain unit 360*a*, a first front-end downlink signal power level detector 362*a* (referred to herein as the first downlink detector 362*a*), and the second front-end duplexer 358*a*.

The first front-end uplink gain unit 354*a* and the first front-end downlink gain unit 360*a* may be configured to apply gains to the uplink and downlink signals, respectively, in the first front-end booster 350*a*. In some embodiments, the gains applied by the first front-end uplink gain unit 354*a* and the first front-end downlink gain unit 360*a* may be controlled by the control unit 370. As a result, the first front-end uplink gain unit 354*a* and the first front-end downlink gain unit 360*a* may adjust the gains applied to the uplink and downlink signals, respectively, in the first front-end booster 350*a* based on instructions, such as a control signal, from the control unit 370.

The first uplink detector 356*a* and the first downlink detector 362*a* may be configured to detect a power level of the uplink and downlink signals, respectively, in the first front-end booster 350*a*. The first uplink detector 356*a* and the first downlink detector 362*a* may be configured to provide the detected power levels to the control unit 370 as the first uplink and downlink power levels.

The second front-end uplink amplification path 351*b* may include a third front-end duplexer 352*b*, a second front-end uplink gain unit 354*b*, a second front-end uplink signal power level detector 356*b* (referred to herein as the second uplink detector 356*b*), and a fourth front-end duplexer 358*b*. The second front-end downlink amplification path 357*b* may include the third front-end duplexer 352*b*, a second front-end downlink gain unit 360*b*, a second front-end downlink signal power level detector 362*b* (referred to herein as the second downlink detector 362*b*), and the fourth front-end duplexer 358*b*.

The second front-end uplink gain unit 354*b* and the second front-end downlink gain unit 360*b* may be configured to apply gains to uplink and downlink signals, respectively, in the second front-end booster 350*b*. In some embodiments, the gains applied by the second front-end uplink gain unit 354*b* and the second front-end downlink gain unit 360*b* may adjust the gains applied to the uplink and downlink signals, respectively, in the second front-end booster 350*b* based on instructions, such as a control signal, from the control unit 370.

The second uplink detector 356*b* and the second downlink detector 362*b* may be configured to detect a power level of the uplink and downlink signals, respectively, in the second front-end booster 350*b*. The second uplink detector 356*b* and the second downlink detector 362*b* may be configured to provide the detected power levels to the control unit 370 as the second uplink and downlink power levels.

The control unit 370 may be coupled to the main booster 330, the first front-end booster 350*a*, and the second front-end booster 350b. The control unit 370 may be configured to receive the main uplink and downlink power levels from the main booster 330, the first uplink and downlink power levels from the first front-end booster 350a, and the second uplink and downlink power levels from the second front-end booster 350b. Collectively, the main uplink and downlink power levels, the first uplink and downlink power levels, and the second uplink and downlink power levels may be referred to herein as the detected power levels.

The control unit 370 may be configured to determine gains that are applied by the main booster 330 and the front-end boosters 350 to uplink and downlink signals based on the detected power levels. For example, when the main downlink power level is a first power level, the control unit 370 may set the gain of the main downlink gain unit 340 to a first gain. Alternately or additionally, when the main downlink power level is a second power level, the control unit 370 may set the gain of the main downlink gain unit 340 to a second gain.

The gains selected by the control unit 370 to be applied by the main booster 330 based on the detected power levels may be configured such that the uplink and downlink signals may be transmitted between an access point and wireless devices, respectively, with SNRs that are sufficient for wireless communications between the access point and the wireless devices. Furthermore, the control unit 370 may select the gain to apply to the main booster 330 based on other factors in a wireless network that includes the system 300. For example, the control unit 370 may select the gains for the main booster 330 based on providing noise floor, internal oscillation, external oscillation (e.g., antenna to antenna oscillations), and/or overload protection for the wireless network.

For example, U.S. Pat. No. 8,583,034 describes adjusting gains of a main booster in a wireless network to provide noise floor, internal oscillation, external oscillation (e.g., port-to-port oscillations), and/or overload protection for a wireless network. The U.S. Pat. No. 8,583,034 is incorporated herein by reference in its entirety.

The control unit 370 may be further configured to adjust the gains applied to the front-end boosters 350 based on the detected power levels. For example, in some embodiments, the control unit 370 may be configured to adjust the gain applied by the first and second front-end uplink gain units 354a and 354b based on the first and second uplink power levels. In these and other embodiments, the control unit 370 may adjust the gain applied by the first and second front-end uplink gain units 354a and 354b such that a power level of a first uplink signal output by the first front-end booster 350a is equal to or approximately equal to a power level of a second uplink signal output by the second front-end booster 350b. A power level of the first uplink signal being approximately equal to a power level of the second uplink signal may indicate that the power levels are within 20% of each other.

By adjusting the gains applied by the front-end boosters 350 such that the first and second uplink signals have equal or approximately equal power levels when received by the main booster 330, the main booster 330 may apply a gain to the first and second uplink signals that assists both of the first and second uplink signals being received by an access point with appropriate SNR levels. For example, assume that the first uplink signal has a higher power level than the second uplink signal when received by the signal booster 302. If both of the front-end boosters 350 applied equal or approximately equal gains to the first and second uplink signals, the first and second uplink signals would be received by the main booster 330 with the first uplink signal having a higher power level than the second uplink signal. The main booster 330 may apply a gain for both the first and second uplink signals based on the highest power level of the first and second uplink signals. Thus, the main booster 330 may apply a gain to both the first and second uplink signals that is configured for the first uplink signal and not the second uplink signal. As a result, the gain applied by the main booster 330 may be sufficient to allow the first uplink signal to reach an access point with an appropriate SNR but may not be sufficient to allow the second uplink signal to reach the access point with the appropriate SNR. By configuring the front-end boosters 350 to apply gains to the first and second uplink signals such that the power levels of the first and second uplink signals are equal or approximately equal, the gain applied by the main booster 330 may be sufficient for both the first and second uplink signals to reach the access point with the appropriate SNR.

Alternately or additionally, in some embodiments, the control unit 370 may be configured to adjust the gain applied by the first and second front-end downlink gain units 360a and 360b based on the first and second downlink power levels. In these and other embodiments, the control unit 370 may be configured to adjust the gain applied by the first and second front-end downlink gain units 360a and 360b based on the first and second downlink power levels such that a power level of a first downlink signal output by the first front-end booster 350a is equal to or approximately equal to a power level of a second downlink signal output by the second front-end booster 350b. Alternately or additionally, the control unit 370 may be configured to have the first and second front-end downlink gain units 360a and 360b apply a constant gain based on signal losses caused by the signal splitter device 320.

As mentioned above, the control unit 370 may be further configured to detect oscillations in the signal booster 302 based on the detected power levels. In these and other embodiments, the control unit 370 may detect internal oscillations that may occur within the main booster 330 or the front-end boosters 350. For example, an internal oscillation in the main booster 330 may occur when one or both of the first and second main duplexers 332 and 338 does not provide adequate isolation between the main uplink amplification path 331 and the main downlink amplification path 337. As a result, the uplink signals and/or the downlink signals may traverse both of the main uplink amplification path 331 and the main downlink amplification path 337, resulting in an internal oscillation in the main booster 330. Similar internal oscillations may occur in the front-end boosters 350.

The control unit 370 may be further configured to detect external, otherwise referred to port-to-port or parasitic oscillations that may occur within the signal booster 302. During an external oscillation, an uplink signal and/or a downlink signal that is output by one of the first, second, or third interface port 304, 306, and 308 is received at another of the first, second, or third interface port 304, 306, and 308. As a result, the uplink signal and/or the downlink signal may be continually amplified and result in an external oscillation. For example, an uplink signal transmitted by the first antenna 310 may be received by the second antenna 314 and the gain of the signal booster 202 may again be applied to the uplink signal such that the power level of the uplink signal increases. This sequence of events is repeated such that the uplink signal has a high gain that results in excessive noise in a wireless network that includes the system 300.

The control unit 370 may be configured to detect internal or external oscillations in the signal booster 302 based on the detected power levels. In particular, the control unit 370 may be configured to detect oscillations in each of the main booster 330 and the front-end boosters 350. For each of the main boosters 330 and the front-end boosters 350, the control unit 370 may detect oscillations by comparing one or more detected power levels at a first time to detected power levels at a second time using any number of oscillation detection schemes. For example, the control unit 370 may detect oscillations in the main booster 330 by collecting first detected power levels of an uplink signal at a first time and collecting second detected uplink power levels of the uplink signal at a second time. Using the first and second uplink detected power levels, the control unit 370 may determine the peak-to-average power ratio (PAPR) of the uplink signal and compare the PAPR to a threshold. When the PAPR is less than a threshold, the control unit 370 may determine that the main booster 330 is oscillating.

After determining whether the main booster 330 and/or the front-end boosters 350 are oscillating, the control unit 370 may determine whether the oscillations are internal or external oscillations. When only one of the main booster 330, the first front-end booster 350a, and the second front-end booster 350b is oscillating, the oscillation may be an internal oscillation of the oscillating main booster 330, the oscillating first front-end booster 350a, or the oscillating second front-end booster 350b. In these and other embodiments, the control unit 370 may adjust the gain applied by the oscillating main booster 330, the oscillating first front-end booster 350a, or the oscillating second front-end booster 350b to stop the internal oscillation. In particular, the control unit 370 may reduce the gain applied by the oscillating main booster 330, the oscillating first front-end booster 350a, or the oscillating second front-end booster 350b to stop the internal oscillation. In these and other embodiments, the control unit 370 may direct that the gain be reduced to zero or near zero to stop the internal oscillation.

For external oscillations, at least the main booster 330 and one of the front-end boosters 350 may be oscillating. In these and other embodiments, the control unit 370 may adjust the gain applied by the main booster 330 to stop the external oscillation. In particular, the control unit 370 may reduce the gain applied by the main booster 330 to stop the external oscillation. In these and other embodiments, the control unit 370 may direct that the gain be reduced to zero or near zero to stop the external oscillation.

Alternately or additionally, the control unit 370 may adjust the gain applied by the oscillating front-end boosters 350 to stop the external oscillation. In particular, the control unit 370 may reduce the gain applied by the oscillating front-end boosters 350 to stop the external oscillation. If only one of the two front-end boosters 350 is oscillating, by adjusting the gain applied by the oscillating front-end boosters 350 and not the main booster 330, the main booster 330 and the other non-oscillating front-end boosters 350 may continue to operate normally without a reduced gain. Alternately or additionally, the control unit 370 may adjust the gain applied by the front-end boosters 350 that are oscillating and the main booster 330 to stop the external oscillation.

In some embodiments, the control unit 370 may be implemented by any suitable mechanism, such as a program, software, function, library, software as a service, analog, or digital circuitry, or any combination thereof. For example, the control unit 370 may include a processor 372 and memory 374. The processor 372 may include, for example, a microprocessor, microcontroller, digital signal processor (DSP), application-specific integrated circuit (ASIC), a Field-Programmable Gate Array (FPGA), or any other digital or analog circuitry configured to interpret and/or to execute program instructions and/or to process data. In some embodiments, the processor 372 may interpret and/or execute program instructions and/or process data stored in the memory 374. The instructions may include instructions for adjusting the gain of the main booster 330 and/or one or more of the front-end boosters 350, among other instructions.

The memory 374 may include any suitable computer-readable media configured to retain program instructions and/or data for a period of time. By way of example, and not limitation, such computer-readable media may include tangible and/or non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general-purpose or special-purpose computer. Combinations of the above may also be included within the scope of computer-readable media. Computer-executable instructions may include, for example, instructions and data that cause a general-purpose computer, special-purpose computer, or special-purpose processing device to perform a certain function or group of functions.

Modifications, additions, or omissions may be made to the system 300 without departing from the scope of the present disclosure. For example, in some embodiments, the signal booster 302 may include additional interface ports that are coupled to antennas that are configured to communicate with wireless devices. In these and other embodiments, each of the interface ports may be coupled to a front-end booster similar to the front-end boosters 350. Alternately or additionally, in some embodiments, the signal booster 302 may not include a front-end booster for each of the interface ports that is coupled to an antenna that communicates with wireless devices. For example, in some embodiments, the signal booster 502 may not include one of the first or second front-end boosters 350.

Furthermore, the signal booster 302 may include multiple other front-end boosters and main boosters. As illustrated, the signal booster 302 may operate to apply gains to a single band of signals in a wireless communication system. In other embodiments, the signal booster 302 may operate to apply gains to multiple bands of signals in a wireless communication system. In these and other embodiments, the signal boosters may include a main booster and front-end boosters as illustrated for every band. The boosters for the bands may be coupled to the first and second antennas 310 and 314 and the communication device 312 in an analogous manner as illustrated in FIG. 2. In these and other embodiments, the control unit 370 may be coupled to each of the main and front-end boosters in each of the bands. Alternately or additionally, each of the main and front-end boosters in each of the bands may be associated with a separate control unit.

In some embodiments, the front-end boosters 350 may not include the first downlink detector 362a and/or the second downlink detector 362b. In these and other embodiments, the control unit 370 may adjust the gain of the first and second front-end downlink gain units 360a and 360b based on other detected power levels or the loss of the signal splitter device 320.

Figure 4:
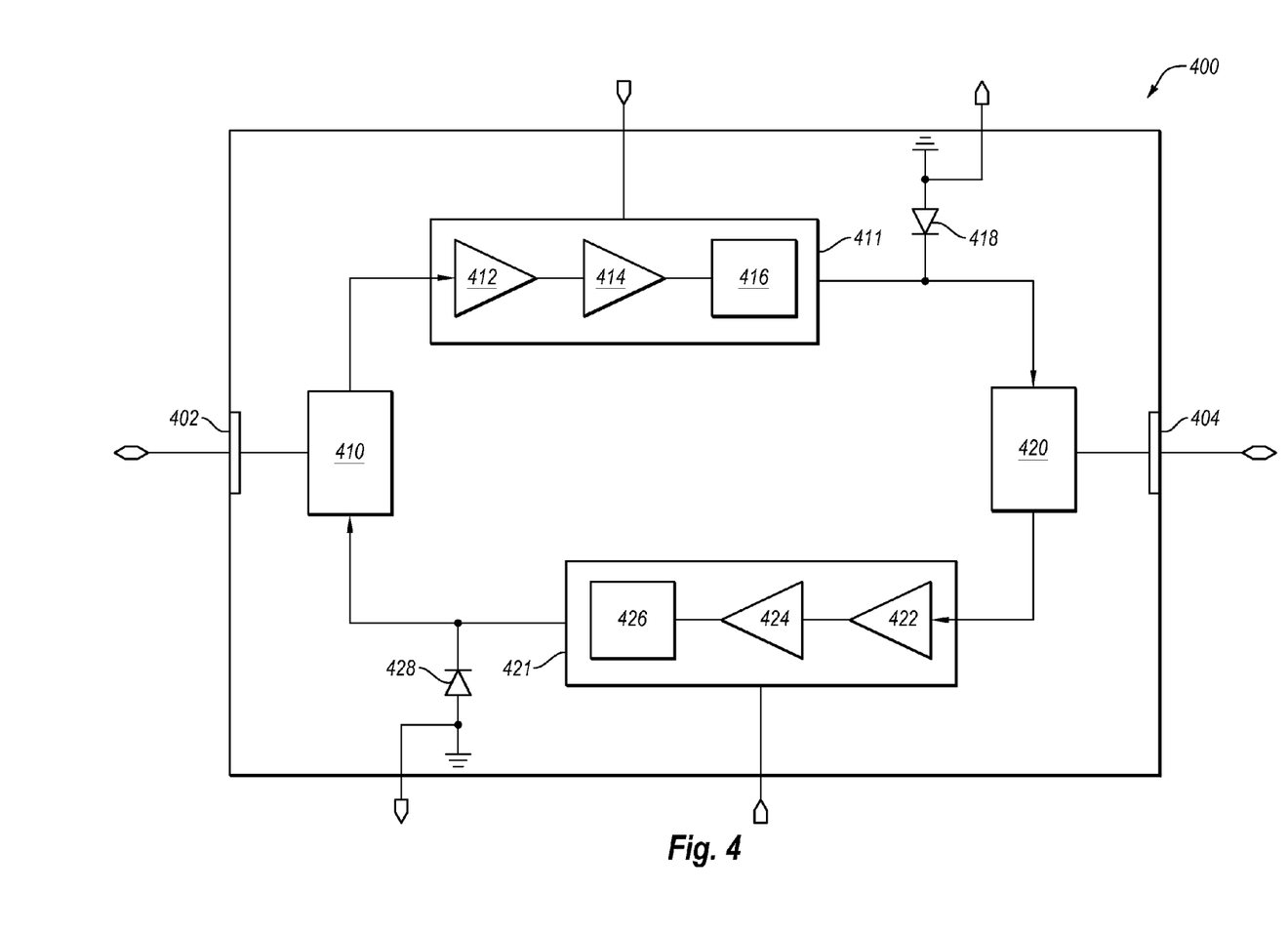
FIG. 4 illustrates an example front-end booster.

FIG. 4 illustrates an example front-end booster 400 (referred to herein as "the booster 400"), arranged in accordance with at least one embodiment described herein. In some embodiments, the booster 400 may be part of a signal booster, such as the signal booster 102, 202, 302, or 502 of FIGS. 1, 2, 3, and 5. In these and other embodiments, the booster 400 may be an example of one of the front-end booster 240, 350, or 530 of FIGS. 2, 3, and 5.

The booster 400 includes a first interface port 402, a second interface port 404, a first duplexer 410, a second duplexer 420, a first gain unit 411, a first diode 418, a second gain unit 421, and a second diode 428.

The first duplexer 410 may be coupled between the first interface port 402, the first gain unit 411, and the second gain unit 421. The second duplexer 420 may be coupled between the second interface port 404, the first gain unit 411, and the second gain unit 421. The first diode 418 may be coupled between the first gain unit 411 and the second interface port 404. The second diode 428 may be coupled between the second gain unit 421 and the first interface port 402.

The first gain unit 411 may include a first amplifier 412, a second amplifier 414, and a first attenuator 416. One or more of the first amplifier 412, the second amplifier 414, and/or the first attenuator 416 may be adjustable such that the gain of the first gain unit 411 may be adjustable. For example, in some embodiments, a control unit, such as the control unit 370 of FIG. 3, may send a signal to the first gain unit 411 to adjust the attenuation of the first attenuator 416 to thereby adjust the gain of the first gain unit 411.

The second gain unit 421 may include a third amplifier 422, a fourth amplifier 424, and a second attenuator 426. One or more of the third amplifier 422, the fourth amplifier 424, and/or the second attenuator 426 may be adjustable such that the gain of the second gain unit 421 may be adjustable. For example, in some embodiments, a control unit, such as the control unit 370 of FIG. 3, may send a signal to the second gain unit 421 to adjust the gain of the third amplifier 422 to thereby adjust the gain of the second gain unit 421.

In some embodiments, the first and second diodes 418 and 428 may be examples of a signal power level detector as discussed with respect to FIG. 3. In these and other embodiments, the first and second diodes 418 and 428 may provide indications of power levels of signals within the booster 400.

An example of the operation of the booster 400 follows. A first direction signal may be received on the first interface port 402 and be directed to the first gain unit 411 by the first duplexer 410. The first direction signal may be amplified by the first and second amplifiers 412 and 414 and then attenuated by the first attenuator 416. The amplified first direction signal may be provided to the second duplexer 420. As the first direction signal passes the first diode 418, the first diode 418 may generate a current that is based on the power level of the first direction signal. The second duplexer 420 may direct the first direction signal to the second interface port 404.

At the same time, before, or after the first direction signal is received at the first interface port 402, a second direction signal may be received at the second interface port 404 and be directed to the second gain unit 421 by the second duplexer 420. The second direction signal may be amplified by the third and fourth amplifiers 422 and 424 and then attenuated by the second attenuator 426. The amplified second direction signal may be provided to the first duplexer 410. As the second direction signal passes the second diode 428, the second diode 428 may generate a current that is based on the power level of the second direction signal. The first duplexer 410 may direct the second direction signal to the first interface port 402.

Modifications, additions, or omissions may be made to the booster 400 without departing from the scope of the present disclosure. For example, in some embodiments, the booster 400 may not include the second diode 428.

Figure 5:
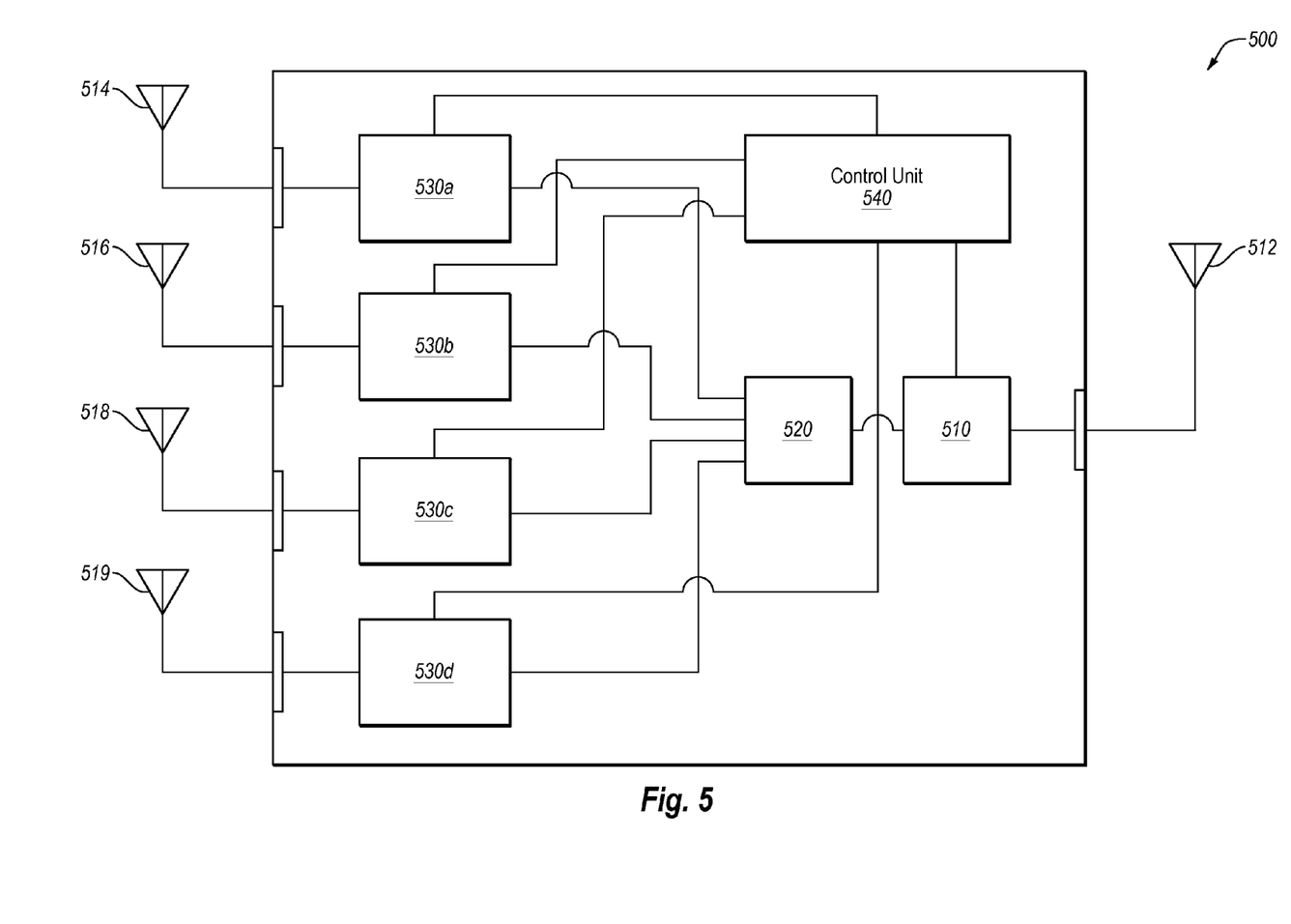
FIG. 5 illustrates another example system with another example multiple-port signal booster.

FIG. 5 illustrates an embodiment of another system 500 with another example multiple-port signal booster 502, arranged in accordance with at least some embodiments described herein. The system 500 may operate in a manner analogous to the operation of the systems 100, 200, and 300 of FIGS. 1, 2, and 3, as described herein. The system 500, however, may include first, second, third, fourth, and fifth antennas 512, 514, 516, 518, and 519. The first antenna 512 may be configured to communicate with an access point. The second, third, fourth, and fifth antennas 514, 516, 518, and 519 may be configured to communicate with wireless devices. The signal booster 502, as illustrated in FIG. 5, may include a main booster 510, a signal splitter device 520, first, second, third, and fourth front-end boosters, 530a, 530b, 530c, and 530d, referred to as the front-end boosters 530, and a control unit 540. Each of the front-end boosters 530 may be configured to receive uplink signals from and send downlink signals to one of the second, third, fourth, and fifth antennas 514, 516, 518, and 519 as illustrated.

The main booster 510 and the front-end boosters 530 may operate to apply gains to uplink and downlink signals as described herein previously. The control unit 540 may operate to control the gains applied by the main booster 510 and the front-end boosters 530.

Modifications, additions, or omissions may be made to the system 500 without departing from the scope of the present disclosure. For example, in some embodiments, the signal booster 502 may include additional interface ports that are coupled to antennas that are configured to communicate with wireless devices. In these and other embodiments, each of the interface ports may be coupled to a front-end booster similar to the front-end boosters 530. Alternately or additionally, in some embodiments, the signal booster 502 may not include a front-end booster for each of the interface ports that is coupled to an antenna that communicates with wireless devices. For example, in some embodiments, the signal booster 502 may not include one of the front-end boosters 530.

Furthermore, the signal booster 502 may include multiple other front-end boosters and main boosters. As illustrated, the signal booster 502 may operate to apply gains to a single band of signals in a wireless communication system. In other embodiments, the signal booster 502 may operate to apply gains to multiple bands of signals in a wireless communication system. In these and other embodiments, the signal booster 502 may include a main booster and front-end boosters as illustrated for every band. The main booster and front-end boosters for the bands may be coupled to the first, second, third, fourth, and fifth antennas 512, 514, 516, 518, and 519 in an analogous manner as illustrated in FIG. 5.

Figure 6:
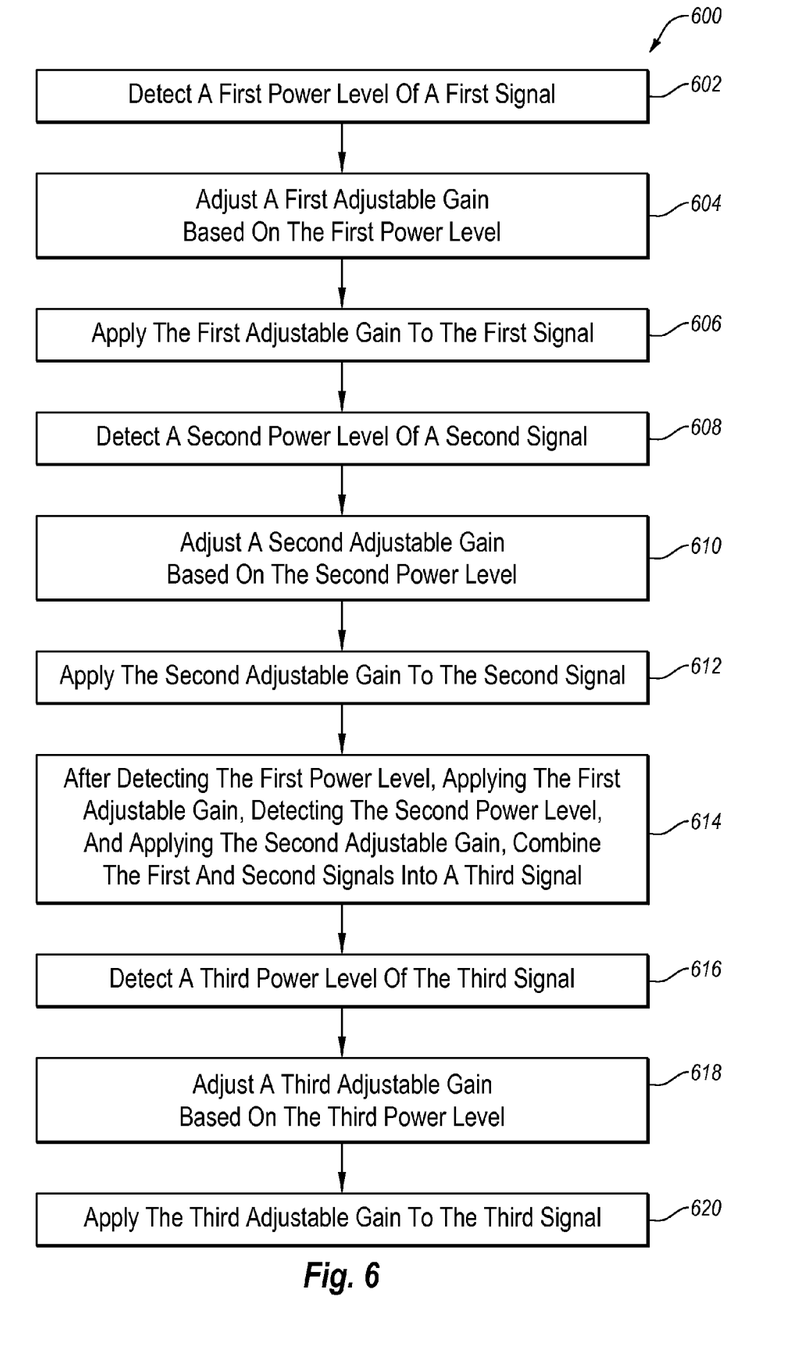
FIG. 6 is a flowchart of an example method of operating a multiple-port signal booster.

FIG. 6 is a flowchart of an example method 600 of operating a multiple-port signal booster, arranged in accordance with at least some embodiments described herein. The method 600 may be implemented, in some embodiments, by a signal booster, such as the signal booster 102, 202, 302, or 502 of FIGS. 1, 2, 3, and 5, respectively. Although illustrated as discrete blocks, various blocks may be divided into additional blocks, combined into fewer blocks, or eliminated, depending on the desired implementation.

The method 600 may begin at block 602, where a first power level of a first signal may be detected. In block 604, a first adjustable gain may be adjusted based on the first power level.

In block 606, the first adjustable gain may be applied to the first signal. In block 608, a second power level of a second signal may be detected. In block 610, a second adjustable gain may be adjusted based on the second power level. In block 612, the second adjustable gain may be applied to the second signal.

In block 614, after detecting the first power level, applying the first adjustable gain, detecting the second power level, and applying the second adjustable gain, the first and second signals may be combined into a third signal.

In block 616, a third power level of the third signal may be detected. In block 618, a third adjustable gain may be adjusted based on the third power level. In block 620, the third adjustable gain may be applied to the third signal.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, in some embodiments, the method 600 may further include comparing the first power level to the second power level. In these and other embodiments, the first adjustable gain may be adjusted based on the comparison and the first power level and the second adjustable gain may be adjusted based on the comparison and the second power level. In some embodiments, the first and second adjustable gains may be adjusted such that the first power level and the second power level are approximately equal.

In some embodiments, the method 600 may further include detecting an oscillation based on the detected first power level or the detected second power level. Alternately or additionally, the method 600 may further include reducing the third adjustable gain based on a detected oscillation.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present invention have been described in detail, it should be understood that the various changes, substitutions, and alterations could be made hereto without departing from the spirit and scope of the invention.

What is claimed is:

1. A signal booster, comprising:
   a first front-end booster including:
      a first signal power level detector configured to detect a first power level of a first signal; and
      a first gain unit with a first adjustable gain configured to be applied to the first signal, the first adjustable gain adjusted based on the first power level;
   a second front-end booster including:
      a second signal power level detector configured to detect a second power level of a second signal; and
      a second gain unit with a second adjustable gain configured to be applied to the second signal, the second adjustable gain adjusted based on the second power level;
   a signal combiner device configured to:
      receive the first signal after the application of the first adjustable gain;
      receive the second signal after the application of the second adjustable gain; and
      combine the first and second signals to form a third signal; and
   a main booster including:
      a third signal power level detector configured to detect a third power level of the third signal; and
      a third gain unit with a third adjustable gain configured to be applied to the third signal, the third adjustable gain adjusted based on the third power level.

2. The signal booster of claim 1, wherein the first signal, the second signal, and the third signal are downlink signals or uplink signals.

3. The signal booster of claim 1, wherein the signal combiner device is an active or passive device and includes one or more of a signal splitter, a coupler, a tap, a resistive splitter, and a Wilkinson divider.

4. The signal booster of claim 1, wherein the first signal, the second signal, and the third signal are uplink signals, wherein the signal combiner device is configured to split a fourth signal into a fifth signal and a sixth signal, the fourth signal, the fifth signal, and the sixth signal being downlink signals.

5. The signal booster of claim 1, wherein each of the first gain unit, the second gain unit, and the third gain unit includes an amplifier chain that includes one or more amplifiers and a variable attenuator.

6. The signal booster of claim 1, further comprising a control unit coupled to the first gain unit, the second gain unit, the first signal power level detector, and the second signal power level detector, the control unit configured to receive the first power level and the second power level and to adjust the first adjustable gain and the second adjustable gain.

7. The signal booster of claim 6, wherein the control unit is configured to adjust the first adjustable gain and the second adjustable gain to cause the first power level and the second power level to be approximately equal.

8. The signal booster of claim 6, wherein the control unit is configured to adjust the first adjustable gain and the second adjustable gain based on a signal loss of the signal combiner device.

9. A method, comprising:
   detecting a first power level of a first signal;
   adjusting a first adjustable gain based on the first power level;
   applying the first adjustable gain to the first signal;
   detecting a second power level of a second signal;
   adjusting a second adjustable gain based on the second power level;
   applying the second adjustable gain to the second signal;
   after detecting the first power level, applying the first adjustable gain, detecting the second power level, and applying the second adjustable gain, combining the first and second signals into a third signal;
   detecting a third power level of the third signal;
   adjusting a third adjustable gain based on the third power level; and
   applying the third adjustable gain to the third signal.

10. The method of claim 9, further comprising comparing the first power level to the second power level, wherein the first adjustable gain is adjusted based on the comparison and the first power level and the second adjustable gain is adjusted based on the comparison and the second power level.

11. The method of claim 9, wherein the first and second adjustable gains are adjusted such that the first power level and the second power level are approximately equal.

12. The method of claim 9, further comprising detecting an oscillation based on the first power level or the second power level.

13. The method of claim 9, further comprising reducing the third adjustable gain based on a detected oscillation.

* * * * *